(12) United States Patent
Lu et al.

(10) Patent No.: US 10,276,744 B2
(45) Date of Patent: Apr. 30, 2019

(54) LIGHT-EMITTING DIODE EPITAXIAL WAFER AND METHOD FOR PREPARING THE SAME

(71) Applicant: HC SEMITEK (SUZHOU) CO., LTD., Suzhou (CN)

(72) Inventors: Xianghua Lu, Suzhou (CN); Lijun Xia, Suzhou (CN); Jiahui Hu, Suzhou (CN); Shizhen Wei, Suzhou (CN)

(73) Assignee: HC SEMITEK (SUZHOU) CO., LTD., Suzhou (CN)

( * ) Notice: Subject to any disclaimer, the term of this patent is extended or adjusted under 35 U.S.C. 154(b) by 0 days.

(21) Appl. No.: 15/719,609

(22) Filed: Sep. 29, 2017

(65) Prior Publication Data

US 2018/0019372 A1 Jan. 18, 2018

Related U.S. Application Data

(63) Continuation-in-part of application No. PCT/CN2016/077759, filed on Mar. 29, 2016.

(30) Foreign Application Priority Data

Mar. 30, 2015 (CN) .......................... 2015 1 0141885

(51) Int. Cl.
*H01L 33/00* (2010.01)
*H01L 33/06* (2010.01)
(Continued)

(52) U.S. Cl.
CPC ............ *H01L 33/06* (2013.01); *H01L 33/007* (2013.01); *H01L 33/12* (2013.01); *H01L 33/32* (2013.01)

(58) Field of Classification Search
CPC ... H01L 33/06; H01L 33/007; H01L 33/0075; H01L 33/12; H01L 33/32; H01L 29/2003;
(Continued)

(56) References Cited

U.S. PATENT DOCUMENTS

2008/0237570 A1* 10/2008 Choi ...................... B82Y 20/00
257/13
2013/0174894 A1* 7/2013 Yoshikawa ....... H01L 31/03048
136/255

* cited by examiner

*Primary Examiner* — Hsien Ming Lee
(74) *Attorney, Agent, or Firm* — Matthias Scholl, PC; Matthias Scholl

(57) ABSTRACT

A light-emitting diode epitaxial wafer, including: a substrate; and a buffer layer, an undoped GaN layer, an n-type GaN contact layer, a multi-quantum well layer, and a p-type GaN contact layer, which are sequentially laminated on the substrate in that order. The multi-quantum well layer includes GaN barrier layers and at least one $In_xGa_{1-x}N$ well layer, where $0<X<1$. At least part of the GaN barrier layers and the at least one $In_xGa_{1-x}N$ well layer include a pre-grown layer provided therebetween; the pre-grown layer is made of InN, or the pre-grown layer is a superlattice structure including InN layers and GaN layers. When the pre-grown layer is a superlattice structure including InN layers and GaN layers, the $In_xGa_{1-x}N$ well layer is adjacent to a GaN layer of the superlattice structure, and the thickness of the pre-grown layer is more than 0 nm and less than 0.3 nm.

10 Claims, 4 Drawing Sheets

(51) Int. Cl.
*H01L 33/12* (2010.01)
*H01L 33/32* (2010.01)

(58) Field of Classification Search
CPC ......... H01L 21/02507; H01L 21/02508; H01L 31/035236; H01L 21/02538
USPC .............................................. 257/80, 81, 94
See application file for complete search history.

LIGHT-EMITTING DIODE EPITAXIAL WAFER AND METHOD FOR PREPARING THE SAME

CROSS-REFERENCE TO RELATED APPLICATIONS

This application is a continuation-in-part of International Patent Application No. PCT/CN2016/077759 with an international filing date of Mar. 29, 2016, designating the United States, now pending, and further claims foreign priority to Chinese Patent Application No. 201510141885.1 filed Mar. 30, 2015. The contents of all of the aforementioned applications, including any intervening amendments thereto, are incorporated herein by reference.

BACKGROUND OF THE INVENTION

Field of the Invention

The invention relates to the field of light emitting diodes, and more particularly to a light-emitting diode epitaxial wafer and method for preparing the same.

Description of the Related Art

Light emitting diodes (LEDs) are widely used in the fields of illumination, display screens, signal lamps, backlight sources, toys, and others. The GaN-based LED is formed by GaN which is p, n-type doped. A typical GaN-based LED epitaxial wafer includes a substrate, an n-type layer, a multi-quantum well layer (also referred to as a light emitting layer) and a p-type layer sequentially laminated on the substrate. Conventionally, a multi-quantum well layer is composed of InGaN quantum wells and GaN quantum barriers.

InGaN and GaN have a large lattice difference, which adversely affects the capture carrier efficiency of the InGaN quantum well and the distribution of the positive and negative carriers in the InGaN quantum well, which is not conducive to improving the luminous efficiency of the GaN-based LED.

SUMMARY OF THE INVENTION

To improve the luminous efficiency of the GaN-based LED, one embodiment of this invention provides a light emitting diode epitaxial wafer and a method for preparing the same.

To achieve the above objective, in accordance with one embodiment of the invention, there is provided a light emitting diode epitaxial wafer comprising a substrate, and a buffer layer, an undoped GaN layer, an n-type GaN contact layer, a multi-quantum well layer and a p-type GaN contact layer which are sequentially laminated on the substrate. The multi-quantum well layer comprises GaN barrier layers and at least one $In_xGa_{1-x}N$ well layer, $0<X<1$. At least part of the GaN barrier layers and the at least one $In_xGa_{1-x}N$ well layer comprise a pre-grown layer provided therebetween. The pre-grown layer is made of InN, or the pre-grown layer is a superlattice structure comprising InN layers and GaN layers. When the pre-grown layer is a superlattice structure comprising InN layers and GaN layers, the $In_xGa_{1-x}N$ well layer is adjacent to the GaN layer of the superlattice structure. A thickness of the pre-grown layer is more than 0 and less than 0.3 nm.

In a class of this embodiment, when the pre-grown layer is made of InN, the thickness of the pre-grown layer is in a range of 0.005 nm-0.2 nm.

In a class of this embodiment, when the pre-grown layer is a superlattice structure comprising InN layers and GaN layers, the GaN layer of the superlattice structure may be an GaN layer doped with Indium (In).

In a class of this embodiment, when the GaN layer of the superlattice structure is doped with Indium (In), the Indium concentration of the GaN layer doped with Indium is 10%-20% of the Indium concentration of the $In_xGa_{1-x}N$ well layer.

In a class of this embodiment, the pre-grown layer is provided between any adjacent GaN barrier layer and $In_xGa_{1-x}N$ well layer.

In a class of this embodiment, the thickness of the $In_xGa_{1-x}N$ well layer is in a range of 1-2 nm, the thickness of the GaN barrier layer is in a range of 7-8 nm.

According to another aspect, one embodiment of the invention provides a growth method of a light emitting diode epitaxial wafer which is suitable for growing the above-mentioned light emitting diode epitaxial wafer. The growth method comprises: depositing a buffer layer, an undoped GaN layer, an n-type GaN contact layer, a multi-quantum well layer and a p-type GaN contact layer on a substrate sequentially; where the multi-quantum well layer comprises GaN barrier layers and at least one $In_xGa_{1-x}N$ well layer, $0<X<1$. At least part of the GaN barrier layers and the at least one $In_xGa_{1-x}N$ well layer comprise a pre-grown layer provided therebetween. The pre-grown layer is made of InN, or the pre-grown layer is a superlattice structure comprising InN layers and GaN layers. When the pre-grown layer is a superlattice structure comprising InN layers and GaN layers, the $In_xGa_{1-x}N$ well layer is adjacent to the GaN layer of the superlattice structure. A thickness of the pre-grown layer is more than 0 and less than 0.3 nm.

In a class of this embodiment, the growth temperature of the pre-grown layer is not lower than the growth temperature of the $In_xGa_{1-x}N$ well layer by 15° C. and is not higher than the growth temperature of the $In_xGa_{1-x}N$ well layer by 20° C.

In a class of this embodiment, the growth temperature of the pre-grown layer is in a range of 650-850° C., and the growth pressure of the pre-grown layer is in a range of 50-300 torr.

In a class of this embodiment, the pre-grown layer is grown in a nitrogen atmosphere.

The solution of the embodiments of the invention can bring the following advantage.

The $In_xGa_{1-x}N$ well layer is grown after the pre-growth layer is grown on the GaN barrier layer, or the pre-grown layer is grown on the $In_xGa_{1-x}N$ well layer. Since the pre-grown layer contains Indium atom, the pre-grown layer can release the stress caused by a lattice mismatch of the GaN lattice and the InN lattice, and prevent the stress from accumulating into the $In_xGa_{1-x}N$ well layer, which will affect the growth of $In_xGa_{1-x}N$ well layer. This enhances the smoothness of the $In_xGa_{1-x}N$ well layer and the homogeneity of the atomic distribution, and ultimately improves the internal quantum efficiency and enhances the luminous efficiency of the GaN-based LEDs.

In addition, it is indicated by tests that if the pre-grown layer has a thickness larger than 0 but less than 0.3 nm, the pressure releasing and the electrical parameters of the LED will reach the optimal balance state. Meanwhile, the electrical parameters of the LED are the same as those of a LED without the pre-grown layer, but the luminous intensity will increase 1.5%-2%.

BRIEF DESCRIPTION OF DRAWINGS

In order to clearly illustrate the technical solution of the embodiments of the invention, the drawings to be used in the description of the embodiments will be briefly described below. Apparently, the drawings in the following description are merely some embodiments of the invention. It will be apparent to those skilled in the art that other drawings may be obtained from these drawings without creative work.

DETAILED DESCRIPTION OF THE EMBODIMENTS

The objects, features and advantages of the present invention will become more apparent from the following description of embodiments of the present invention when taken in conjunction with the accompanying drawings.

Example 1

Figure 1:
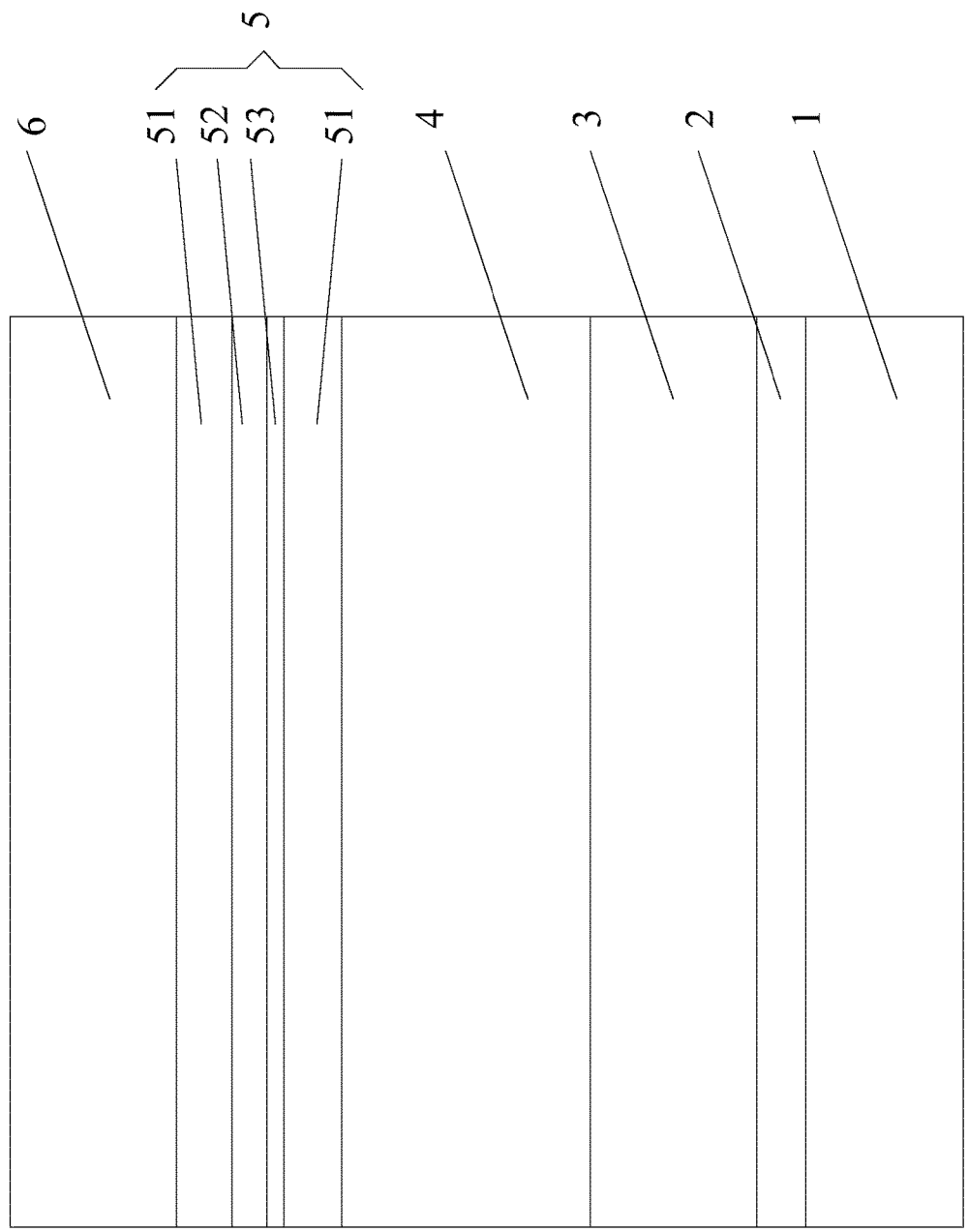
FIG. 1 is a schematic view of a light emitting diode epitaxial wafer according to an embodiment of the invention.
Figure 2:
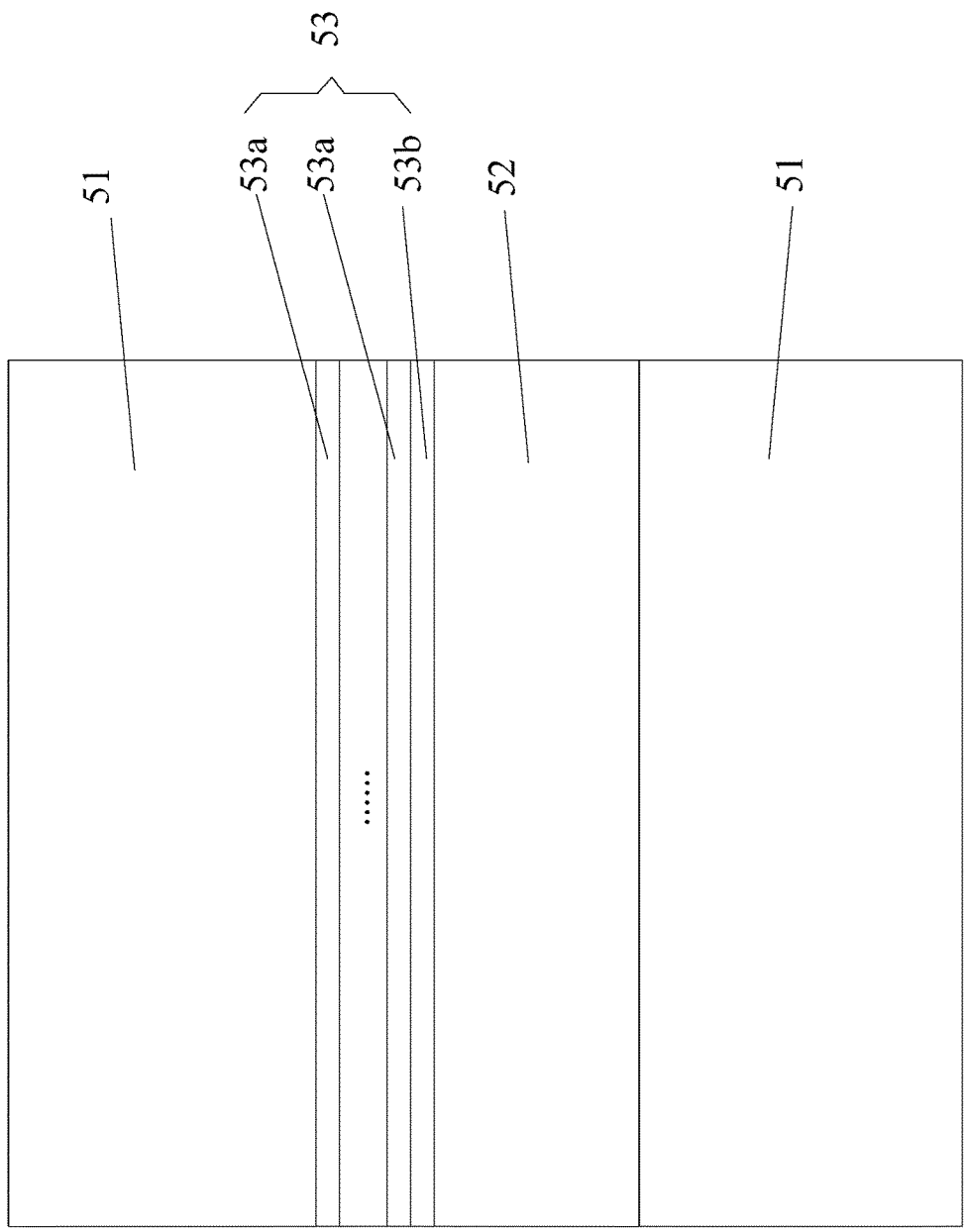
FIG. 2 is a schematic view illustrating a structure of a multi-quantum well layer according to the embodiment of the invention.

There is provided a light emitting diode epitaxial wafer according to an embodiment of the invention. Referring to FIG. 1, the light emitting diode epitaxial wafer comprises a substrate 1, and a low temperature buffer layer 2, an undoped GaN layer 3, an n-type GaN contact layer 4, a multi-quantum well layer 5 and a p-type GaN contact layer 6 which are sequentially laminated on the substrate 1. The multi-quantum well layer 5 comprises GaN barrier layers 51 and InxGa1−xN well layers 52, 0<X<1.

At least part of the GaN barrier layers 51 and the at least one InxGa1−xN well layer 52 has a pre-grown layer 53 provided therebetween. The pre-grown layer 53 is made of InN, or the pre-grown layer 53 is a superlattice structure comprising InN layers 53a and GaN layers 53b. When the pre-grown layer 53 is a superlattice structure comprising InN layers 53a and GaN layers 53b, the InxGa1−xN well layer 52 is adjacent to the GaN layer 53b of the superlattice structure, and a thickness of the pre-grown layer 53 is more than 0 and less than 0.3 nm.

Figure 3:
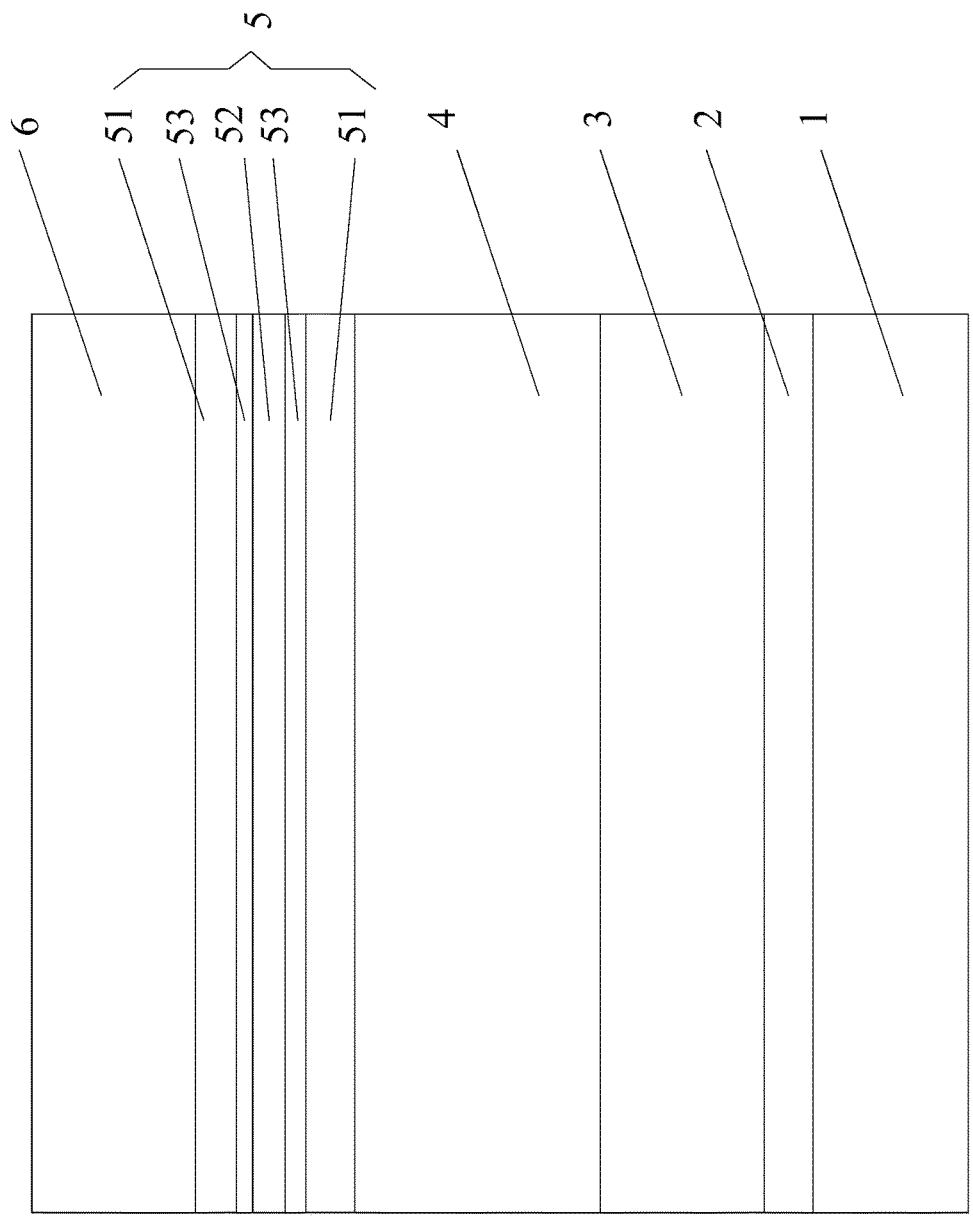
FIG. 3 is a schematic view of a light emitting diode epitaxial wafer according to another embodiment of the invention.

As an alternative implementation, referring to FIG. 3, the multi-quantum well layer 5 comprises two GaN barrier layers 51 and one InxGa1−xN well layer 52. The InxGa1−xN well layer 52 is sandwiched between the two GaN barrier layers 51. At least part of the GaN barrier layers and the at least one InxGa1−xN well layer having a pre-grown layer provided therebetween means that the InxGa1−xN well layer 52 and one of the two GaN barrier layers 51 have a pre-grown layer 53 provided therebetween, or means that the InxGa1−xN well layer 52 and the two GaN barrier layers 51 have a pre-grown layer 53 provided therebetween, respectively. Preferably, the pre-grown layer 13 is provided between any adjacent GaN barrier layer 51 and InxGa1−xN well layer 52.

The thickness of the InxGa1−xN well layer is in a range of 1-2 nm. The thickness of the GaN barrier layer is in a range of 7-8 nm.

Since the Indium (In) atom has a large difference from the Ga atom and the N atom in the radius (the radius of the Indium (In) atom is 144 pm, the radius of the Ga atom is 126 pm, the radius of the N atom is 70 pm), if the GaN barrier layer is directly grown on the InxGa1−xN well layer 52, the normal GaN lattice will be broken thus resulting in a dislocation defect. And the bond energy between the Indium (In) atom, the Ga atom and the N atom is large, a strong stress will accumulate in the InxGa1−xN well layer 52, which makes the surface of the InxGa1−xN well layer 52 rough and the atomic distribution uneven, affects the carrier's recombination efficiency, and increases the absorption of light in the active layer, thereby reducing the internal quantum efficiency. After growing a pre-grown layer 53 on the GaN barrier layers 51, since the pre-grown layer 53 contains Indium (In) atom, the stress accumulated in the InxGa1−xN well layer 52 is released in the pre-grown layer 53 in advance such that the InxGa1−xN well layer 52 is more suitable to be grown on the pre-grown layer 53 to enhance the smoothness of the InxGa1−xN well layer 52 and the homogeneity of the atomic distribution. For the same reason, the pre-grown layer 53 grown on the InxGa1−xN well layer 52 also can release the stress accumulated in the InxGa1−xN well layer 52, enhance the smoothness of the InxGa1−xN well layer 52 and the homogeneity of the atomic distribution, and ultimately improves the internal quantum efficiency.

Further, the thicker the pre-grown layer 53 is, the more conducive to release the stress in the InxGa1−xN well layer 52. But if the thickness of the pre-grown layer 53 is too large, the electrical parameters (comprising a work voltage, an anti-static electricity capacity of the LED device) of the LED will show a trend of deterioration. It is indicated by tests that if the pre-grown layer has a thickness larger than 0 but less than 0.3 nm, the pressure releasing and the electrical parameters of the LED will reach the optimal balance state. Meanwhile, the electrical parameters of the LED are the same as those of a LED without the pre-grown layer, but the luminous intensity will increase 1.5%-2%.

When the pre-grown layer 53 is made of InN, the thickness of the pre-grown layer 53 is in a range of 0.005 nm-0.2 nm.

When the pre-grown layer 53 is made of InN, it is possible to provide an Indium (In) atmosphere for the growth of the InxGa1−xN well layer 52 adjacent to the pre-grown layer 53. When the InxGa1−xN well layer 52 is grown, the desorption behavior of the Indium atom can be suppressed so that the component content of Indium in the InxGa1−xN well layer 52 can be increased, and the growth quality of the InxGa1−xN well layer 52 can be improved.

In addition, if the InN layer is too thick, the positive working voltage of the LED device will be raised, and the anti-static ability will be deteriorated. It is indicated by tests that if the pre-grown layer 53 has a thickness of 0.005 nm-0.2 nm, the pressure releasing and the electrical parameters of the LED will reach the optimal balance state. Meanwhile, the electrical parameters of the LED are the same as those of a LED without the pre-grown layer, but the luminous intensity will increase 2%.

When the pre-grown layer 53 is a superlattice structure comprising InN layers 53a and GaN layers 53b, the GaN layer of the superlattice structure may be an GaN layer doped with In.

It is indicated by test that if the pre-grown layer 53 has a thickness larger than 0.3 nm, the positive working voltage of the LED device will be increased by 0.1V, which will reduce the life of the LED. When the pre-grown layer 53 is a superlattice structure comprising InN layers 53a and GaN layers 53b and the thickness of the pre-grown layer is more than 0 and less than 0.3 nm, the luminous efficiency of the LED device is increased by about 1.5%, and the electrical parameters of the LED is comparable to the electrical parameters of a LED without the pre-grown layer 53.

If the GaN layer 53b of the superlattice structure is doped with Indium (In), the incorporation of Indium in the InxGa1−xN well layer 52 and the homogeneity of Indium in the InxGa1−xN well layer 52 will be improved, the component content of Indium in the InxGa1−xN well layer 52 will be increased so that the luminous intensity of the LED device is increased by about 2%.

When the GaN layer 53b of the superlattice structure is doped with Indium (In), the Indium (In) concentration of the GaN layer 53b doped with Indium (In) is 10%-20% of the Indium (In) concentration of the InxGa1−xN well layer 52.

It has been experimentally tested that when the Indium (In) concentration in the GaN layer 53b doped with Indium (In) of the superlattice structure is less than 10% of the Indium (In) concentration in the InxGa1−xN well layer 52, the light intensity of the LED device does not change much compared to the GaN layer 53b undoped with In. When the Indium (In) concentration in the GaN layer 53b doped with Indium (In) of the superlattice structure is 10%-20% of the Indium (In) concentration in the InxGa1−xN well layer 52, the light intensity of the LED device increase by 2% compared to the GaN layer 53b undoped with In. When the Indium (In) concentration in the GaN layer 53b doped with Indium (In) of the superlattice structure is more than 20% of the Indium concentration in the InxGa1−xN well layer 52, the light intensity of the LED device increase by 0.5% compared to the GaN layer 53b undoped with In.

The InxGa1−xN well layer is grown after the pre-growth layer is grown on the GaN barrier layer, or the pre-grown layer is grown on the InxGa1−xN well layer. Since the pre-grown layer contains Indium (In) atom, the pre-grown layer can release the stress caused by a lattice mismatch of the GaN lattice and the InN lattice, and prevent the stress from accumulating into the InxGa1−xN well layer, which will affect the growth of InxGa1−xN well layer. This enhances the smoothness of the InxGa1−xN well layer and the homogeneity of the atomic distribution, and ultimately improves the internal quantum efficiency and enhances the luminous efficiency of the GaN-based LEDs.

In addition, it is indicated by tests that if the pre-grown layer has a thickness larger than 0 but less than 0.3 nm, the pressure releasing and the electrical parameters of the LED will reach the optimal balance state. Meanwhile, the electrical parameters of the LED are the same as those of a LED without the pre-grown layer, but the luminous intensity will increase 1.5%-2%.

Example 2

Figure 4:
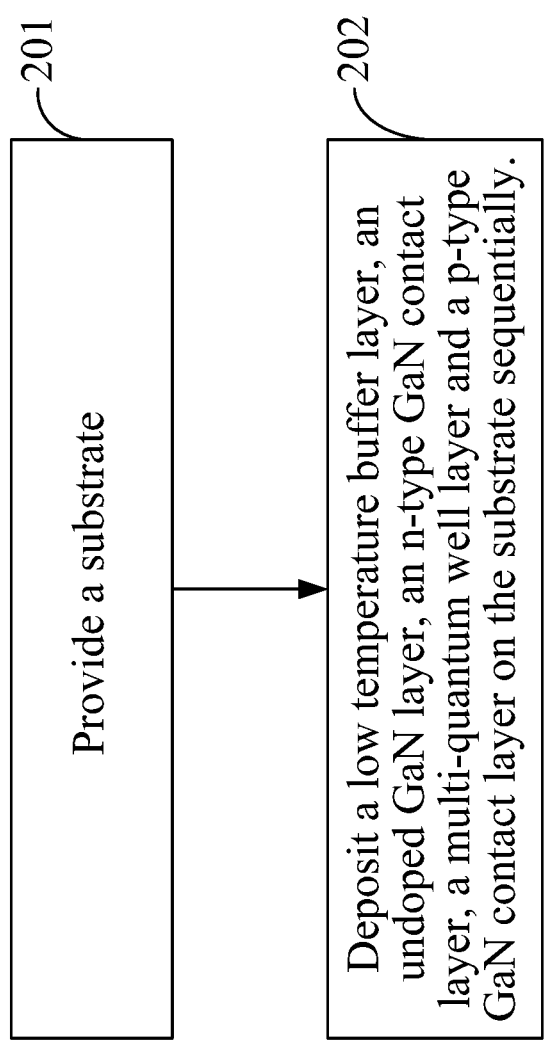
FIG. 4 is a flow chart of a growth method of a light emitting diode epitaxial wafer according to an embodiment of the invention.

There is provided a growth method of a light-emitting diode epitaxial wafer which is suitable for growing the light-emitting diode epitaxial wafer provided in Embodiment 1. Referring to FIG. 4, the method comprises:

Step 201: Provide a substrate.

The substrate may be a sapphire substrate.

Step 202: Deposit a low temperature buffer layer, an undoped GaN layer, an n-type GaN contact layer, a multi-quantum well layer and a p-type GaN contact layer on the substrate sequentially.

The multi-quantum well layer comprises GaN barrier layers and at least one InxGa1−xN well layer, 0<X<1. At least part of the GaN barrier layers and the at least one InxGa1−xN well layer comprise a pre-grown layer provided therebetween. A thickness of the pre-grown layer is more than 0 and less than 0.3 nm. The pre-grown layer is made of InN, or the pre-grown layer is a superlattice structure comprising InN layers and GaN layers. When the pre-grown layer is a superlattice structure comprising InN layers and GaN layers, the InxGa1−xN well layer is adjacent to the GaN layer of the superlattice structure.

Optionally, the pre-grown layer is provided between any adjacent GaN barrier layer and InxGa1−xN well layer.

The growth temperature of the pre-grown layer is not lower than the growth temperature of the InxGa1−xN well layer by 15° C. and is not higher than the growth temperature of the InxGa1−xN well layer by 20° C.

When the growth temperature of the pre-grown layer is much lower than the growth temperature of the InxGa1−xN well layer, for example, 25° C. lower than the growth temperature of the InxGa1−xN well layer, it is found that the crystal quality of the InxGa1−xN well layer is deteriorated. When the growth temperature of the pre-grown layer is much higher than the growth temperature of the InxGa1−xN well layer, for example, 35° C. higher than the growth temperature of the InxGa1−xN well layer, it is found that the Indium (In) is easy to precipitate and hard to dope, thus decreasing the Indium component content in the InxGa1−xN well layer. It is indicated by experiments that the quality of the InxGa1−xN well layer is best when the growth temperature of the pre-grown layer is not lower than the growth temperature of the InxGa1−xN well layer by 15° C. and is not higher than the growth temperature of the InxGa1−xN well layer by 20° C.

The growth temperature of the GaN barrier layer, the InxGa1−xN well layer, and the pre-grown layer may be 650-850° C., and the growth pressure may be 50-300 torr.

The pre-grown layer is grown in a nitrogen atmosphere.

It should be noted that the low temperature buffer layer, the undoped GaN layer, the n-type GaN contact layer, the multi-quantum well layer and the p-type GaN contact layer can be grown in the conventional growth manner, and the present invention will not limit it.

Specifically, the low temperature buffer layer, the undoped GaN layer, the n-type GaN contact layer, the multi-quantum well layer and the p-type GaN contact layer can be sequentially deposited on the substrate by a Metal-organic Chemical Vapor Deposition (MOCVD) method. In the deposition process, trimethyl (or triethyl) gallium can be used as gallium source, high purity NH3 can be used as nitrogen source, trimethyl indium can be used as indium source, trimethyl aluminum can be used as aluminum source, n-type doping can use silane, and p-type doping can use Magnesium.

The InxGa1−xN well layer is grown after the pre-growth layer is grown on the GaN barrier layer, or the pre-grown layer is grown on the InxGa1−xN well layer. Since the pre-grown layer contains Indium (In) atom, the pre-grown layer can release the stress caused by a lattice mismatch of the GaN lattice and the InN lattice, and prevent the stress from accumulating into the InxGa1−xN well layer, which will affect the growth of InxGa1−xN well layer. This enhances the smoothness of the InxGa1−xN well layer and the homogeneity of the atomic distribution, and ultimately improves the internal quantum efficiency and enhances the luminous efficiency of the GaN-based LEDs.

In addition, it is indicated by tests that if the pre-grown layer has a thickness larger than 0 but less than 0.3 nm, the pressure releasing and the electrical parameters of the LED will reach the optimal balance state. Meanwhile, the electrical parameters of the LED are the same as those of a LED without the pre-grown layer, but the luminous intensity will increase 1.5%-2%.

The numbers of the above-described embodiments of the present invention are for the sake of description only and do not mean the pros and cons of the embodiment.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A light-emitting diode epitaxial wafer, comprising:
a substrate; and
a buffer layer, an undoped GaN layer, an n-type GaN contact layer, a multi-quantum well layer and a p-type GaN contact layer which are sequentially laminated on the substrate in that order; the multi-quantum well layer comprising GaN barrier layers and at least one $In_xGa_{1-x}N$ well layer, $0<X<1$;
wherein:
at least part of the GaN barrier layers and the at least one $In_xGa_{1-x}N$ well layer comprise a pre-grown layer provided therebetween;
the pre-grown layer is made of InN, or the pre-grown layer is a superlattice structure comprising InN layers and GaN layers;
when the pre-grown layer is a superlattice structure comprising InN layers and GaN layers, the $In_xGa_{1-x}N$ well layer is adjacent to a GaN layer of the superlattice structure, and a thickness of the pre-grown layer is more than 0 nm and less than 0.3 nm; and
when the pre-grown layer is made of InN, the thickness of the pre-grown layer is in a range of 0.005 nm-0.2 nm.

2. The epitaxial wafer of claim 1, wherein the pre-grown layer is provided between any GaN barrier layer and the $In_xGa_{1-x}N$ well layer.

3. The epitaxial wafer of claim 1, wherein a thickness of the $In_xGa_{1-x}N$ well layer is in a range of 1-2 nm, and a thickness of the GaN barrier layer is in a range of 7-8 nm.

4. A light-emitting diode epitaxial wafer, comprising:
a substrate; and
a buffer layer, an undoped GaN layer, an n-type GaN contact layer, a multi-quantum well layer and a p-type GaN contact layer which are sequentially laminated on the substrate in that order; the multi-quantum well layer comprising GaN barrier layers and at least one $In_xGa_{1-x}N$ well layer, $0<X<1$;
wherein:
at least part of the GaN barrier layers and the at least one $In_xGa_{1-x}N$ well layer comprise a pre-grown layer provided therebetween;
the pre-grown layer is made of InN, or the pre-grown layer is a superlattice structure comprising InN layers and GaN layers;
when the pre-grown layer is a superlattice structure comprising InN layers and GaN layers, the $In_xGa_{1-x}N$ well layer is adjacent to a GaN layer of the superlattice structure, and a thickness of the pre-grown layer is more than 0 nm and less than 0.3 nm; and
when the pre-grown layer is a superlattice structure comprising InN layers and GaN layers, the GaN layer of the superlattice structure is a GaN layer doped with Indium.

5. The epitaxial wafer of claim 4, wherein when the GaN layer of the superlattice structure is doped with Indium, an Indium concentration of the GaN layer doped with Indium is 10%-20% of an Indium concentration of the $In_xGa_{1-x}N$ well layer.

6. The epitaxial wafer of claim 4, wherein the pre-grown layer is provided between any GaN barrier layer and the $In_xGa_{1-x}N$ well layer.

7. The epitaxial wafer of claim 4, wherein a thickness of the $In_xGa_{1-x}N$ well layer is in a range of 1-2 nm, and a thickness of the GaN barrier layer is in a range of 7-8 nm.

8. A method for producing a light-emitting diode epitaxial wafer, the method comprising depositing a buffer layer, an undoped GaN layer, an n-type GaN contact layer, a multi-quantum well layer and a p-type GaN contact layer on a substrate sequentially in that order;
wherein:
the multi-quantum well layer comprises GaN barrier layers and at least one $In_xGa_{1-x}N$ well layer, $0<X<1$;
at least part of the GaN barrier layers and the at least one $In_xGa_{1-x}N$ well layer comprise a pre-grown layer provided therebetween;
the pre-grown layer is made of InN, or the pre-grown layer is a superlattice structure comprising InN layers and GaN layers;
when the pre-grown layer is a superlattice structure comprising InN layers and GaN layers, the $In_xGa_{1-x}N$ well layer is adjacent to a GaN layer of the superlattice structure, a thickness of the pre-grown layer is more than 0 nm and less than 0.3 nm; and
a growth temperature of the pre-grown layer is not lower than a growth temperature of the $In_xGa_{1-x}N$ well layer by 15° C. and is not higher than the growth temperature of the $In_xGa_{1-x}N$ well layer by 20° C.

9. The method of claim 8, wherein the growth temperature of the pre-grown layer is 650-850° C., and a growth pressure of the pre-grown layer is 50-300 torr.

10. The method of claim 9, wherein the pre-grown layer is grown in a nitrogen atmosphere.

* * * * *